(12) United States Patent
Hasegawa et al.

(10) Patent No.: US 10,439,034 B2
(45) Date of Patent: Oct. 8, 2019

(54) SEMICONDUCTOR DEVICE AND METHOD FOR MANUFACTURING SAME

(71) Applicant: Panasonic Intellectual Property Management Co., Ltd., Osaka (JP)

(72) Inventors: Takashi Hasegawa, Toyama (JP); Kouichi Saitou, Toyama (JP); Chiaki Kudou, Toyama (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/188,332

(22) Filed: Nov. 13, 2018

(65) Prior Publication Data

US 2019/0165119 A1 May 30, 2019

(30) Foreign Application Priority Data

Nov. 28, 2017 (JP) ................. 2017-227649

(51) Int. Cl.
| | |
|---|---|
| *H01L 29/45* | (2006.01) |
| *H01L 23/535* | (2006.01) |
| *H01L 29/40* | (2006.01) |
| *H01L 21/311* | (2006.01) |
| *H01L 21/324* | (2006.01) |
| *H01L 21/768* | (2006.01) |

(52) U.S. Cl.
CPC ...... *H01L 29/456* (2013.01); *H01L 21/31116* (2013.01); *H01L 21/31144* (2013.01); *H01L 21/324* (2013.01); *H01L 21/76877* (2013.01); *H01L 23/535* (2013.01); *H01L 29/401* (2013.01)

(58) Field of Classification Search
CPC .... H01L 29/401; H01L 29/456; H01L 23/535
See application file for complete search history.

(56) References Cited

U.S. PATENT DOCUMENTS

| | | | | |
|---|---|---|---|---|
| 5,940,732 A | * | 8/1999 | Zhang | ............... H01L 21/31111 257/E21.251 |
| 6,365,932 B1 | * | 4/2002 | Kouno | ................ H01L 27/0255 257/133 |

(Continued)

FOREIGN PATENT DOCUMENTS

| | | |
|---|---|---|
| JP | 2012-129503 | 7/2012 |
| JP | 2016-115735 | 6/2016 |

*Primary Examiner* — Peniel M Gumedzoe
(74) *Attorney, Agent, or Firm* — McDermott Will & Emery LLP (57) ABSTRACT

A semiconductor device according to an exemplary embodiment includes a semiconductor substrate, a gate insulating layer, a gate electrode, an interlayer insulating layer, a contact hole, a metal layer, and a source line. The gate electrode is disposed on the gate insulating layer. The interlayer insulating layer covers the gate electrode. The contact hole penetrates the gate insulating layer and the interlayer insulating layer, causes a portion of the surface of the semiconductor substrate to be exposed, and includes an inner surface defined by a side surface of the interlayer insulating layer and a side surface of the gate insulating layer. The metal layer covers an upper surface of the interlayer insulating layer, the inner surface of the contact hole, and at least part of the portion of the surface of the semiconductor substrate exposed by the contact hole.

7 Claims, 7 Drawing Sheets

(56) References Cited

U.S. PATENT DOCUMENTS

| | | | |
|---|---|---|---|
| 2003/0030108 A1* | 2/2003 | Morosawa | H01L 29/458 257/359 |
| 2007/0232005 A1* | 10/2007 | Maruyama | H01L 29/41733 438/299 |
| 2012/0132912 A1 | 5/2012 | Suekawa et al. | |
| 2013/0299849 A1* | 11/2013 | Tega | H01L 29/0607 257/77 |
| 2017/0194438 A1* | 7/2017 | Kumagai | H01L 29/0865 |

* cited by examiner

SEMICONDUCTOR DEVICE AND METHOD FOR MANUFACTURING SAME

BACKGROUND

1. Technical Field

The present disclosure relates to a semiconductor device and a method for manufacturing the semiconductor device.

2. Description of the Related Art

A power semiconductor device is a semiconductor element having a high breakdown voltage and used for passing a large electric current, and is required to be a low-loss element. Conventionally, power semiconductor devices using a silicon (Si) substrate have been widely used, however, power semiconductor devices using a silicon carbide (SiC) substrate are attracting attention and subjected to development in recent years.

Silicon carbide has a higher breakdown voltage than silicon by one digit, and has a characteristic of maintaining a breakdown voltage even with a thin depletion layer at a pn junction or a Schottky contact. Accordingly, use of such silicon carbide enables a reduction in the thickness of a device, and also enables an increase in doping concentration. Thus, silicon carbide is expected as a promising material for power semiconductor devices that achieve low on-resistance, high breakdown voltage, and low loss.

In recent years, vehicles driven by a motor, such as hybrid vehicles, electric vehicles, and fuel cell vehicles, have been developed. Since the above-described characteristics of silicon carbide are advantageous to a switching element of an inverter circuit that drives a motor for these vehicles, silicon carbide based power semiconductor devices for vehicles have been under development.

In a power semiconductor device using a silicon carbide substrate, it is known that a gate threshold voltage may fluctuate in a high-temperature environment. For example, PTL 1 discloses a semiconductor device that suppresses such fluctuation in a gate threshold voltage.

CITATION LIST

Patent Literature

PTL 1: Unexamined Japanese Patent Publication No. 2012-129503

SUMMARY

The present disclosure provides a novel technique to improve reliability of a semiconductor device, such as a power semiconductor device. Hereinafter, a power semiconductor device is referred to as a semiconductor device.

A semiconductor device according to one aspect of the present disclosure includes a semiconductor substrate, a gate insulating layer, a gate electrode, an interlayer insulating layer (The interlayer insulating layer is called ILD: interlayer dielectric as alias.), a contact hole, a metal layer, and a source line. The gate insulating layer is disposed on a surface of the semiconductor substrate. The gate electrode is disposed on the gate insulating layer. The interlayer insulating layer covers the gate electrode. The contact hole penetrates the gate insulating layer and the interlayer insulating layer, causes a portion of the surface of the semiconductor substrate to be exposed, and includes an inner surface defined by a side surface of the interlayer insulating layer and a side surface of the gate insulating layer. The metal layer covers an upper surface of the interlayer insulating layer, the inner surface of the contact hole, and at least part of the portion of the surface of the semiconductor substrate exposed by the contact hole. The source line is connected, via the contact hole, with at least part of the metal layer that covers the at least part of the portion of the surface of the semiconductor substrate exposed by the contact hole. The inner surface of the contact hole faces an opening of the contact hole in a cross-sectional view perpendicular to the surface of the semiconductor substrate. The inner surface of the contact hole includes a first inner surface close to the surface of the semiconductor substrate, and a second inner surface close to the opening of the contact hole. An angle formed by the first inner surface of the contact hole and the surface of the semiconductor substrate is smaller than an angle formed by the second inner surface of the contact hole and the surface of the semiconductor substrate.

A method for manufacturing a semiconductor device according to another aspect of the present disclosure includes first to tenth steps. In the first step, a semiconductor substrate is prepared. In the second step, a gate insulating layer is provided on a surface of the semiconductor substrate. In the third step, a gate electrode is provided on the gate insulating layer. In the fourth step, the gate electrode is covered with an interlayer insulating layer. In the fifth step, a mask layer is provided on the interlayer insulating layer. In the sixth step, the interlayer insulating layer and the gate insulating layer are etched by using the mask layer to provide a contact hole that causes a portion of the surface of the semiconductor substrate to be exposed and includes an inner surface defined by a side surface of the interlayer insulating layer and a side surface of the gate insulating layer. In the seventh step, the mask layer is removed. In the eighth step, a silicide layer is formed by performing annealing while the portion of the surface of the semiconductor substrate exposed by the contact hole is covered with metal. In the ninth step, a metal layer that covers an upper surface of the interlayer insulating layer, the inner surface of the contact hole, and at least part of the silicide layer is provided. In the tenth step, a source line connected, via the contact hole, with at least part of the metal layer that covers the at least part of the silicide layer is provided. The metal layer has a thickness equal to or greater than 35 nm at least at a portion that covers a lower part of the inner surface of the contact hole.

The comprehensive or specific aspects of the present disclosure described above may be implemented by a system, a method, an integrated circuit, a computer program, or a storage medium. Alternatively, the aspects may be implemented by any desired combinations of a system, an apparatus, a procedure, an integrated circuit, a computer program, and a storage medium.

The technique according to the present disclosure improves reliability of a semiconductor device.

DETAILED DESCRIPTION

The inventors of the present disclosure have found that the semiconductor device according to PTL 1 may not fully suppress fluctuation in a gate threshold voltage in a high-temperature environment.

PTL 1 discloses a semiconductor device that suppresses a decline with age in a gate threshold voltage by providing a barrier metal layer between an interlayer insulating layer and a source line, and prevents a short circuit between gate and source electrodes.

The fluctuation in a gate threshold voltage is caused by entry of mobile ions into a gate insulating layer. Accordingly, fluctuation in a gate threshold voltage can be prevented by providing a sufficient thickness to a barrier metal layer.

According to the semiconductor device of PTL 1, a barrier metal layer covers a side surface of an interlayer insulating layer that is substantially perpendicular to a semiconductor substrate. However, this configuration has difficulty in providing a sufficient thickness to the perpendicular side surface of the barrier metal layer due to a reason described below. As a result, fluctuation in the gate threshold voltage may not be sufficiently suppressed.

In view of the above, the inventors of the present disclosure have derived a semiconductor device and a method for manufacturing the semiconductor device as defined in the following items.

[Item 1]

A semiconductor device includes a semiconductor substrate, a gate insulating layer, a gate electrode, an interlayer insulating layer, a contact hole, a metal layer, and a source line.

The gate insulating layer is disposed on a surface of the semiconductor substrate.

The gate electrode is disposed on the gate insulating layer.

The interlayer insulating layer covers the gate electrode.

The contact hole penetrates the gate insulating layer and the interlayer insulating layer, causes a portion of the surface of the semiconductor substrate to be exposed, and includes an inner surface defined by a side surface of the interlayer insulating layer and a side surface of the gate insulating layer.

The metal layer covers an upper surface of the interlayer insulating layer, the inner surface of the contact hole, and at least part of the portion of the surface of the semiconductor substrate exposed by the contact hole.

The source line is connected, via the contact hole, with at least part of the metal layer that covers the at least part of the portion of the surface of the semiconductor substrate exposed by the contact hole.

In the semiconductor device, the metal layer has a thickness equal to or greater than 35 nm at least at a portion that covers part of the inner surface of the contact hole near the semiconductor substrate.

[Item 2]

In the semiconductor device according to item 1, provided that a first thickness is a thickness of the metal layer at the portion that covers part of the inner surface of the contact hole near the surface of the semiconductor substrate, and a second thickness is a thickness of the metal layer at a portion that covers the upper surface of the interlayer insulating layer, the first thickness is equal to or greater than 35% of the second thickness.

[Item 3]

In the semiconductor device according to item 1 or 2, the inner surface of the contact hole faces an opening of the contact hole in a cross-sectional view perpendicular to the surface of the semiconductor substrate, and an angle formed by the surface of the semiconductor substrate and a lower part of the inner surface of the contact hole is less than or equal to 75°.

[Item 4]

In the semiconductor device according to item 3, the inner surface of the contact hole includes a first inner surface that is close to the surface of the semiconductor substrate, and a second inner surface that is farther from the surface of the semiconductor substrate than the first inner surface is, a first angle formed by the first inner surface of the contact hole and the surface of the semiconductor substrate is smaller than a second angle formed by the second inner surface of the contact hole and the surface of the semiconductor substrate, and the first angle is less than or equal to 75°.

[Item 5]

A semiconductor device includes a semiconductor substrate, a gate insulating layer, a gate electrode, an interlayer insulating layer, a contact hole, a metal layer, and a source line.

The gate insulating layer is disposed on a surface of the semiconductor substrate.

The gate electrode is disposed on the gate insulating layer.

The interlayer insulating layer covers the gate electrode.

The contact hole penetrates the gate insulating layer and the interlayer insulating layer, causes a portion of the surface of the semiconductor substrate to be exposed, and includes an inner surface defined by a side surface of the interlayer insulating layer and a side surface of the gate insulating layer.

The metal layer covers an upper surface of the interlayer insulating layer, the inner surface of the contact hole, and at least part of the portion of the surface of the semiconductor substrate exposed by the contact hole.

The source line is connected, via the contact hole, with at least part of the metal layer that covers the at least part of the portion of the surface of the semiconductor substrate exposed by the contact hole.

The inner surface of the contact hole faces an opening of the contact hole in a cross-sectional view perpendicular to the surface of the semiconductor substrate. The inner surface of the contact hole includes a first inner surface close to the surface of the semiconductor substrate, and a second inner surface close to the opening of the contact hole. An angle formed by the first inner surface of the contact hole and the surface of the semiconductor substrate is smaller than an angle formed by the second inner surface of the contact hole and the surface of the semiconductor substrate.

[Item 6]

In the semiconductor device according to any one of items 1 to 5, the portion of the surface of the semiconductor substrate exposed by the contact hole is a silicide layer formed of silicide.

[Item 7]

In the semiconductor device according to item 6, part of the silicide layer covers the side surface of the gate insulating layer.

[Item 8]

In the semiconductor device according to any one of items 1 to 7, the metal layer has a two-layered structure formed of two different metals.

[Item 9]

In the semiconductor device according to any one of Items 1 to 8, the semiconductor device is a metal oxide semiconductor field effect transistor (MOSFET).

[Item 10]

A method for manufacturing a semiconductor device includes first to tenth steps described below.

The first step is a step of preparing a semiconductor substrate.

The second step is a step of providing a gate insulating layer on a surface of the semiconductor substrate.

The third step is a step of providing a gate electrode on the gate insulating layer.

The fourth step is a step of covering the gate electrode with an interlayer insulating layer.

The fifth step is a step of providing a mask layer on the interlayer insulating layer.

The sixth step is a step of etching the interlayer insulating layer and the gate insulating layer by using the mask layer to provide a contact hole that causes a portion of the surface of the semiconductor substrate to be exposed and includes an inner surface defined by a side surface of the interlayer insulating layer and a side surface of the gate insulating layer.

The seventh step is a step of removing the mask layer.

The eighth step is a step of forming a silicide layer by performing annealing while a portion of the surface of the semiconductor substrate exposed by the contact hole is covered with metal.

The ninth step is a step of providing a metal layer that covers an upper surface of the interlayer insulating layer, the inner surface of the contact hole, and at least part of the silicide layer.

The tenth step is a step of providing a source line connected, via the contact hole, with at least part of the metal layer that covers the at least part of the silicide layer.

In the above method for manufacturing a semiconductor device, the metal layer has a thickness equal to or greater than 35 nm at least at a portion that covers a lower part of the inner surface of the contact hole.

[Item 11]

A method for manufacturing a semiconductor device includes first to tenth steps described below.

The first step is a step of preparing a semiconductor substrate.

The second step is a step of providing a gate insulating layer on a surface of the semiconductor substrate.

The third step is a step of providing a gate electrode on the gate insulating layer.

The fourth step is a step of covering the gate electrode with an interlayer insulating layer.

The fifth step is a step of providing a mask layer on the interlayer insulating layer.

The sixth step is a step of etching the interlayer insulating layer and the gate insulating layer by using the mask layer to provide a contact hole that causes a portion of the surface of the semiconductor substrate to be exposed and includes an inner surface defined by a side surface of the interlayer insulating layer and a side surface of the gate insulating layer.

The seventh step is a step of removing the mask layer.

The eighth step is a step of forming a silicide layer by performing annealing while a portion of the surface of the semiconductor substrate exposed by the contact hole is covered with metal.

The ninth step is a step of providing a metal layer that covers an upper surface of the interlayer insulating layer, the inner surface of the contact hole, and at least part of the silicide layer.

The tenth step is a step of providing a source line connected, via the contact hole, with at least part of the metal layer that covers the at least part of the silicide layer.

In the above method for manufacturing a semiconductor device, the inner surface of the contact hole faces an opening of the contact hole in a cross-sectional view perpendicular to the surface of the semiconductor substrate. The inner surface of the contact hole includes a first inner surface close to the surface of the semiconductor substrate, and a second inner surface close to the opening of the contact hole. An angle formed by the first inner surface of the contact hole and the surface of the semiconductor substrate is smaller than an angle formed by the second inner surface of the contact hole and the surface of the semiconductor substrate.

[Item 12]

In the method for manufacturing a semiconductor device according to item 11, a surface of the interlayer insulating layer that covers the gate electrode in the fourth step includes a flat part and a slope part. The mask layer provided in the fifth step includes an opening to define the contact hole. The flat part and the slope part of the surface of the interlayer insulating layer are present in the opening of the mask layer.

[Item 13]

In the method for manufacturing a semiconductor device according to any one of items 10 to 12, the etching is performed by using a mixed gas of $CHF_3$, $CF_4$, and Ar in the sixth step.

[Item 14]

In the method for manufacturing a semiconductor device according to item 13, a step of performing the etching for 60 seconds and a cooling step after the etching are repeated in the sixth step.

This improves reliability of a semiconductor device.

The following describes a more specific exemplary embodiment of the present disclosure. However, redundantly detailed description may be omitted. For example, detailed description of any already well-known matter and duplicate description of substantially identical configurations may be omitted. This is to avoid unnecessary redundancy of the following description and facilitate understanding by those skilled in the art. Note that the attached drawings and the following description are provided for those skilled in the art to fully understand the present disclosure, and are not intended to limit the subject matter as described in the appended claims. In the following description, components having identical or similar functions are denoted by the same reference numerals or symbols.

(Exemplary Embodiment)

A general description of the present disclosure will be given below with reference to schematic diagrams. The present disclosure relates to a relationship between a shape of an inner surface of a contact hole described below and a thickness of a metal layer disposed on the side surface. A semiconductor device according to the present exemplary embodiment is, for example, a metal oxide semiconductor field effect transistor (MOSFET).

Figure 1:
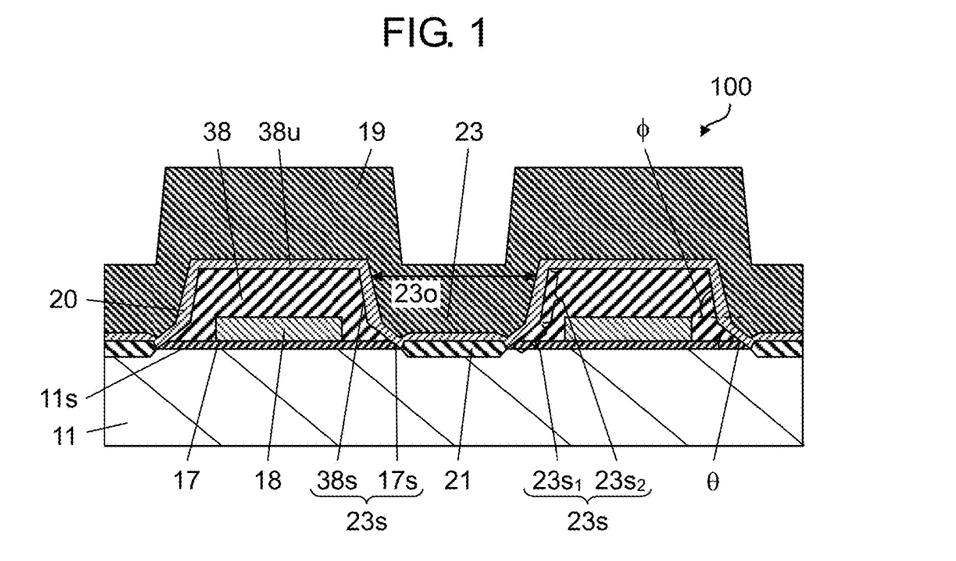
FIG. 1 is a cross-sectional view schematically showing a configuration example of semiconductor device 100 according to an exemplary embodiment.
Figure 2:
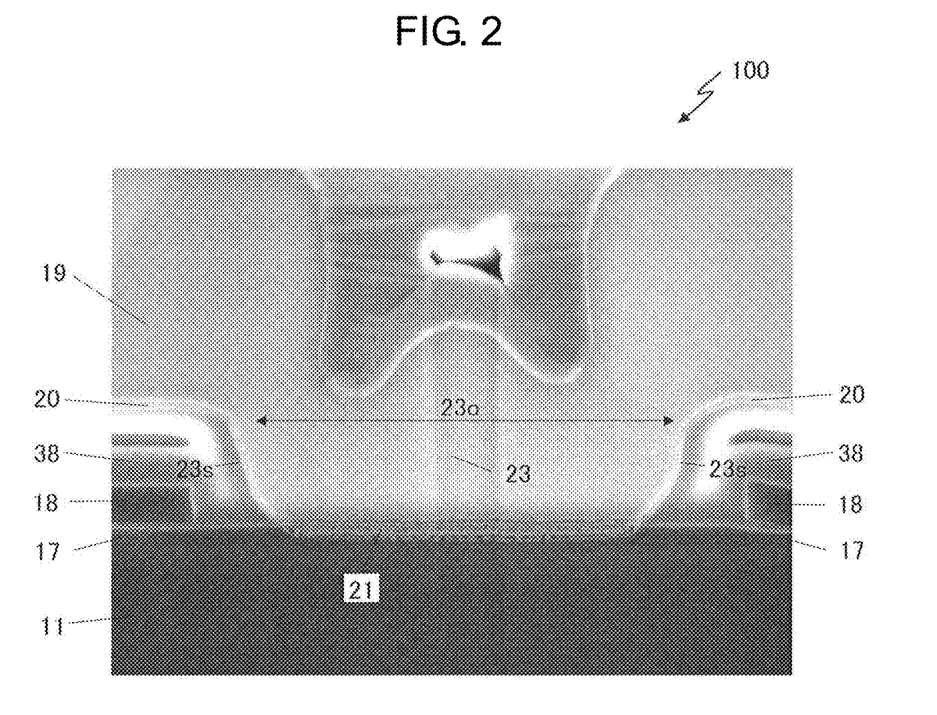
FIG. 2 shows an example of a scanning electron microscope photograph of a section of semiconductor device 100 according to the exemplary embodiment.

FIG. 1 is a cross-sectional view schematically showing a configuration example of semiconductor device 100 according to the present exemplary embodiment. FIG. 2 shows an example of a scanning electron microscope photograph of a section of semiconductor device 100 according to the present exemplary embodiment. In an example shown in FIGS. 1 and 2, semiconductor device 100 is a MOSFET. Hereinafter, descriptions of components identical to those in the conventional technique may be omitted.

Semiconductor device 100 according to the present exemplary embodiment includes semiconductor substrate 11, gate insulating layer 17, gate electrode 18, interlayer insulating layer 38, contact hole 23, metal layer 20, and source line 19.

Semiconductor substrate 11 is formed of silicon carbide, but may be formed of a semiconductor material other than silicon carbide.

Gate insulating layer 17 is disposed on surface 11s of the semiconductor substrate. Gate insulating layer 17 is an insulating layer obtained by thermally oxidizing surface 11s of the semiconductor substrate, for example.

Gate electrode 18 is disposed on gate insulating layer 17. Gate electrode 18 is formed of, for example, polysilicon.

Interlayer insulating layer 38 covers gate electrode 18. Interlayer insulating layer 38 is formed of, for example, non-doped silicate glass (NSG).

Contact hole 23 penetrates gate insulating layer 17 and interlayer insulating layer 38 to cause a portion of surface 11s of the semiconductor substrate to be exposed. An upper part of contact hole 23 is opening 23o of the contact hole. Inner surface 23s of the contact hole is defined by side surface 38s of the interlayer insulating layer and side surface 17s of the gate insulating layer.

The exposed portion of surface 11s of the semiconductor substrate may be silicide layer 21 formed of silicide which is a compound of silicon and metal. Silicide layer 21 forms an ohmic contact. Silicide layer 21 is formed of, for example, NiSi, i.e., a compound of Si and Ni. In the following description, the exposed portion of surface 11s of the semiconductor substrate is silicide layer 21.

Metal layer 20 covers upper surface 38u of the interlayer insulating layer, inner surface 23s of the contact hole, and at least part of silicide layer 21. Metal layer 20 has a thickness equal to or greater than 35 nm at least at a portion that covers lower inner surface $23s_1$ of the contact hole described below. Lower inner surface $23s_1$ of the contact hole is present in a range from 0 nm to 600 nm (inclusive) from surface 11s of the semiconductor substrate in a perpendicular direction. Metal layer 20 may have a two-layered structure formed of two different metals. Metal layer 20 has a two-layered structure formed of, for example, a Ti layer and a TiN layer.

Metal layer 20 may cover side surface 17s of the gate insulating layer. In the case where silicide layer 21 projects from surface 11s of the original semiconductor substrate, part of silicide layer 21 may cover side surface 17s of the gate insulating layer.

Source line 19 is connected, via contact hole 23, with at least part of metal layer 20 that covers at least the part of the silicide layer 21. Then, a portion of semiconductor substrate 11 that is in contact with silicide layer 21 corresponds to a source electrode (not shown). Source line 19 may entirely cover metal layer 20. Source line 19 is formed of, for example, aluminum (Al). Further, another conductive material may be disposed on source line 19.

In practice, a drain electrode (not shown) is disposed on the other surface of semiconductor substrate 11 opposite to the surface including gate insulating layer 17 and the like. Other lines may be disposed on the drain electrode.

In a conventional semiconductor device having thin metal layer 20, a gate threshold voltage is known to fluctuate in a high-temperature environment. The following two reasons are considered to be the causes of such fluctuation.

(Reason 1) In the case where metal layer 20 is thin, mobile ions existing outside the semiconductor device pass through a thin part of metal layer 20 and enter from at least one of side surface 17s of the gate insulating layer and side surface 38s of the interlayer insulating layer in a high-temperature environment. Part of the mobile ions thus entered are captured into gate insulating layer 17 at a position between semiconductor substrate 11 and gate electrode 18. This may cause fluctuation of a gate threshold voltage.

(Reason 2) Mobile ions included in interlayer insulating layer 38 are captured by metal layer 20. However, thin metal layer 20 can capture only a small number of mobile ions. Thus, the mobile ions remaining in interlayer insulating layer 38 are captured into gate insulating layer 17 at a position between semiconductor substrate 11 and gate electrode 18. This may cause fluctuation of a gate threshold voltage.

Metal layer 20 with a sufficient thickness at inner surface 23s of the contact hole can suppress such fluctuation of a gate threshold voltage caused by entry of the mobile ions into gate insulating layer 17. In other words, metal layer 20 serves as a barrier metal or a trap layer for preventing mobile ions from entering gate insulating layer 17. Metal layer 20 with a sufficient thickness at lower inner surface $23s_1$ of the contact hole within inner surface 23s of the contact hole is considered to produce an effect of suppressing fluctuation of a gate threshold voltage.

However, a conventional semiconductor device has difficulty in providing a sufficient thickness to metal layer 20 at inner surface 23s of the contact hole. This is because inner surface 23s of the contact hole according to a conventional semiconductor device is substantially perpendicular to surface 11s of the semiconductor substrate.

Metal layer 20 is commonly provided on inner surface 23s of the contact hole by sputtering metal. The sputtering process causes metal particles to be sputtered toward interlayer insulating layer 38 perpendicularly and diagonally with respect to surface 11s of the semiconductor substrate. Then, a portion of metal layer 20 that covers upper surface 38u of the interlayer insulating layer are formed by the metal particles sputtered from both of the perpendicular and diagonal directions. The metal particles sputtered from the perpendicular direction make an extremely greater contribution to thickening of a deposited layer than those sputtered from the diagonal direction. In general, the number of metal particles is the largest in a direction parallel to the perpendicular direction. The number of metal particles decreases as the angle from the perpendicular direction becomes larger. On the other hand, part of metal layer 20 that covers perpendicular inner surface 23s of the contact hole is formed mainly of the metal particles sputtered from the diagonal direction, since perpendicular inner surface 23s has a small projected area with respect to the perpendicular direction. Accordingly, a thickness of metal layer 20 at perpendicular inner surface 23s of the contact hole is smaller than those at upper surface 38u of the interlayer insulating layer.

The thickness of metal layer 20 at inner surface 23s of the contact hole decreases as the distance from opening 23o of the contact hole increases. This is because contribution of the metal particles decreases, since the angle from the perpendicular direction of the metal particles sputtered from the diagonal direction becomes larger as the distance from opening 23o of the contact hole increases. Accordingly, a conventional semiconductor device can hardly provide sufficient thickness to metal layer 20 at perpendicular inner surface 23s of the contact hole.

In view of the above, semiconductor device 100 of the present exemplary embodiment includes inner surface 23s of the contact hole that is less inclined with respect to surface 11s of the semiconductor substrate. The projected area with respect to the perpendicular direction increases as inner surface 23s is less inclined, which leads to an increase in contribution of the metal particles sputtered from the perpendicular direction at the time of providing metal layer 20. Accordingly, metal layer 20 is expected to have a sufficient thickness at inner surface 23s of the contact hole.

In the example shown in FIGS. 1 and 2, inner surface 23s of the contact hole faces opening 23o of the contact hole and is positioned at an angle smaller than 90° from surface 11s of the semiconductor substrate in a cross-sectional view perpendicular to surface 11s of the semiconductor substrate so that inner surface 23s of the contact hole is less inclined. The thickness of metal layer 20 is smaller at inner surface 23s of the contact hole than at upper surface 38u of the interlayer insulating layer. The thickness of metal layer 20 at inner surface 23s of the contact hole decreases as the distance from opening 23o of the contact hole increases. The reason of this is the same as that of the conventional semiconductor device described above.

In the example shown in FIGS. 1 and 2, inner surface 23s of the contact hole includes lower inner surface $23s_1$ located closer to surface 11s of the semiconductor substrate and upper inner surface $23s_2$ located closer to opening 23o of the contact hole. Angle θ formed by lower inner surface $23s_1$ of the contact hole and surface 11s of the semiconductor substrate is smaller than angle φ formed by upper inner surface $23s_2$ of the contact hole and surface 11s of the semiconductor substrate (θ<φ). In other words, lower inner surface $23s_1$ of the contact hole is less inclined than upper inner surface $23s_2$ of the contact hole. Angles θ, φ correspond to angles of inclination.

In the example shown in FIGS. 1 and 2, the thickness of metal layer 20 is smaller at lower inner surface $23s_1$ of the contact hole than at upper inner surface $23s_2$ of the contact hole. However, since the inclination of the lower part is small, decrease in the thickness of metal layer 20 at lower inner surface $23s_1$ of the contact hole is suppressed to a certain extent as compared to the case where the upper part and lower part are equally inclined.

Hereinafter, the thickness of metal layer 20 at lower inner surface $23s_1$ of the contact hole is mainly described. As compared to the thickness of metal layer 20 at lower inner surface $23s_1$ of the contact hole, the other part of metal layer 20 has a large thickness.

Figure 3:
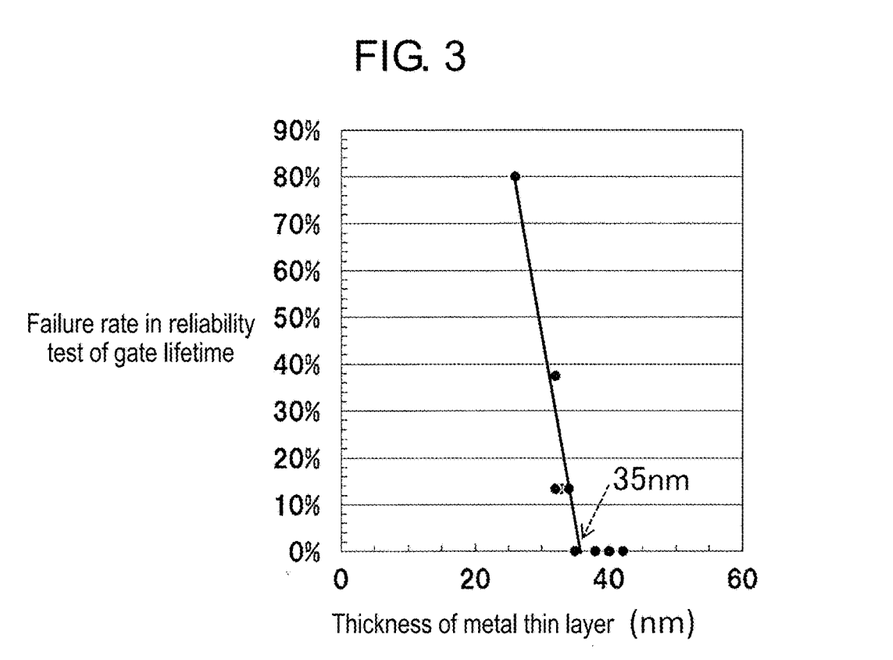
FIG. 3 is an example of a graph showing a relationship between thicknesses of metal layer 20 at lower inner surface 23s1 of a contact hole in semiconductor device 100 according to the exemplary embodiment and failure rates in a reliability test of gate lifetime.

FIG. 3 is an example of a graph showing a relationship between thicknesses of metal layer 20 at lower inner surface $23s_1$ of a contact hole in semiconductor device 100 according to the present exemplary embodiment and failure rates in a reliability test of gate lifetime. In the reliability test of gate lifetime of the present exemplary embodiment, a voltage of 25 V is applied to gate electrode 18 in a state in which a semiconductor element is enclosed in a plastic package while maintaining the temperature at 175° C. The failure rate refers to a ratio of semiconductor elements of which source-drain leakage current has increased when electrical characteristics are measured after the semiconductor elements have been maintained in the above condition for 1000 hours. The source-drain leakage current increases when a gate threshold voltage is decreased at least at part of the lower part of gate electrode 18. Metal layer 20 has a two-layered structure including an upper layer formed of TiN and a lower layer formed of Ti. The ratio of the thicknesses between the upper layer and the lower layer is typically 2:1.

As shown in FIG. 3, the failure rate in the reliability test of gate lifetime decreases as the thickness of metal layer 20 at lower inner surface $23s_1$ of the contact hole increases. The failure rate in the reliability test of gate lifetime is substantially 0% when the thickness of metal layer 20 at side surface 17s of the gate insulating layer is equal to or greater than 35 nm. In other words, fluctuation of a gate threshold voltage can be suppressed in a high-temperature environment when the thickness of metal layer 20 is equal to or greater than 35 nm at least at lower inner surface $23s_1$ of the contact hole within inner surface 23s of the contact hole. This increases reliability of semiconductor device 100.

The thickness of metal layer 20 at side surface 17s of the gate insulating layer increases as an inclination of side surface 17s of the gate insulating layer is decreased. An inclination of lower inner surface $23s_1$ of the contact hole is defined by using angle θ described above (see FIG. 1). Hereinafter, angle θ is referred to as a "taper angle".

Figure 4:
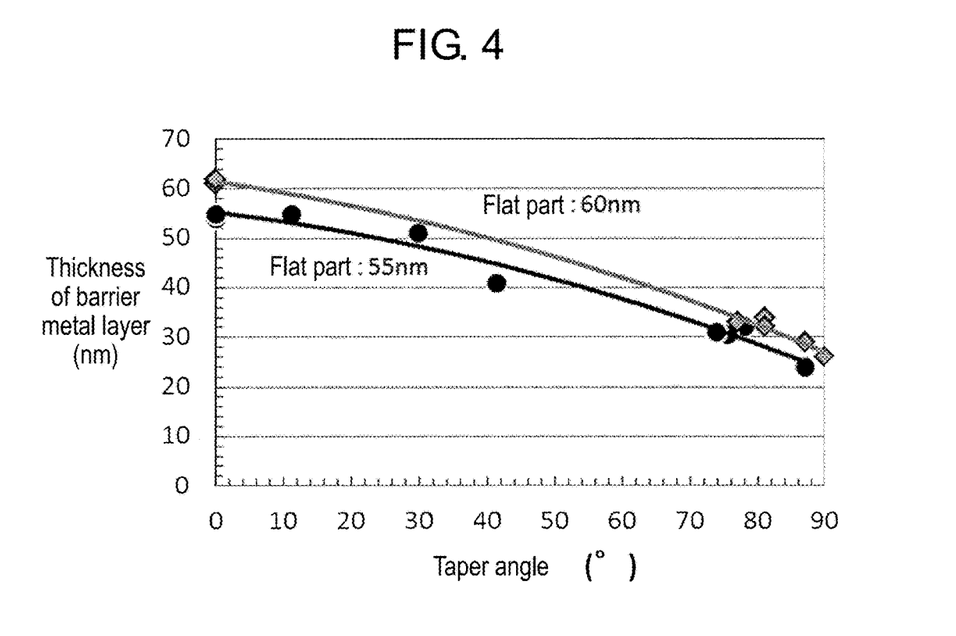
FIG. 4 is an example of a graph showing a relationship between taper angles and thicknesses of metal layer 20 at upper inner surface $23s_2$ of the contact hole.

FIG. 4 is an example of a graph showing a relationship between taper angles and thicknesses of metal layer 20 at upper inner surface $23s_2$ of the contact hole. The example in FIG. 4 shows the case where metal layer 20 with a thickness of 60 nm is deposited on upper surface 38u that is a flat part of the interlayer insulating layer and the case where metal layer 20 with a thickness of 55 nm is deposited on upper surface 38u of the interlayer insulating layer. As shown in FIG. 4, the thickness of metal layer 20 at upper inner surface $23s_2$ of the contact hole decreases as the taper angle increases from 0°. It can be seen that the lines representing the relationship between the taper angles and the thicknesses of metal layer 20 are curved in the same manner, even when the thickness of metal layer 20 at upper surface 38u that is a flat part of the interlayer insulating layer varies. The taper angle 0° represents the case where contact hole 23 is not provided, i.e., the case where part of interlayer insulating layer 38 at which metal layer 20 is deposited is parallel to surface 11s of the semiconductor substrate. The thickness of metal layer 20 when the taper angle is 0° corresponds to the thickness of metal layer 20 at upper surface 38u of the interlayer insulating layer.

Figure 5:
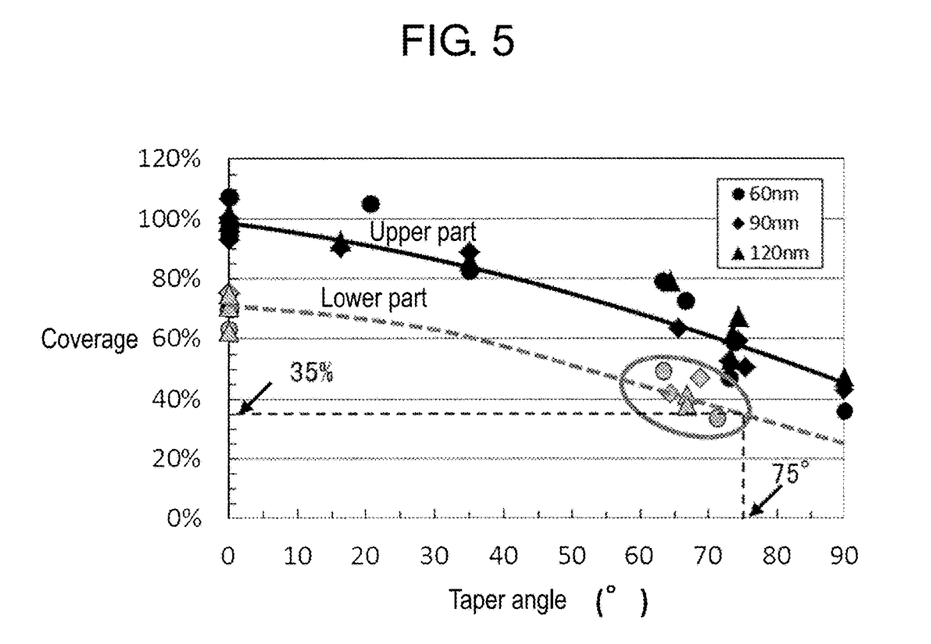
FIG. 5 is an example of a graph in which a thickness of metal layer 20 is standardized into coverages with reference to taper angle 0° in FIG. 4.

FIG. 5 is an example of a graph in which the thicknesses of metal layer 20 is standardized into coverages with reference to taper angle 0° in FIG. 4. The circles, rhombuses, and triangles in FIG. 5 respectively represent the cases where the thicknesses of metal layer 20 at upper surface 38u that is a flat part of the interlayer insulating layer are 60 nm, 90 nm, and 120 nm. The symbols in black color represent coverages at upper inner surface $23s_2$ of the contact hole, and the symbols in gray color represent coverages at lower inner surface $23s_1$ of the contact hole.

It can be seen from FIG. 5 that the coverage at upper inner surface $23s_2$ of the contact hole varies in a curved line without depending on the thickness of metal layer 20 at upper surface 38u that is a flat part of the interlayer insulating layer, but depending on the taper angle. On the other hand, it can be seen that the coverage at lower inner surface $23s_1$ of the contact hole is smaller than the coverage at upper inner surface $23s_2$ of the contact hole as described above. In other words, the thickness of metal layer 20 is smaller at lower inner surface $23s_1$ of the contact hole than at upper inner surface $23s_2$ of the contact hole. Metal layer 20 at upper inner surface $23s_2$ and at lower inner surface $23s_1$ of the contact hole varies in the same manner with respect to the taper angle. Accordingly, metal layer 20 can be made thick by decreasing the taper angles at both of upper inner surface $23s_2$ and lower inner surface $23s_1$ of the contact hole within inner surface 23s of the contact hole.

In the example shown in FIGS. 1 and 2, metal layer 20 at lower inner surface $23s_1$ of the contact hole can have a thickness of equal to or greater than 35 nm by decreasing the taper angle or by increasing the thickness of metal layer 20 to be deposited.

According to conventional semiconductor devices, the taper angle can actually be made less than 90°. However, the taper angle less than 90°, for example, the taper angle less than or equal to 85°, cannot be achieved unless an inclination of inner surface 23s of the contact hole is intentionally decreased.

The coverage of lower inner surface $23s_1$ of the contact hole is 25% when the taper angle is 90°, and thus the thickness of metal layer 20 at upper surface 38u that is a flat part of the interlayer insulating layer can be set equal to or greater than 140 nm (=35 nm÷0.25). However, the thickness of metal layer 20 serves as series resistance on a current path of the semiconductor device. Accordingly, there is an adverse effect of causing an increase in resistance. When part of an aluminum layer that is source line 19 is etched for removal, it is common that metal layer 20 disposed under source line 19 is also removed by dry etching simultaneously. However, there is an adverse effect that it is hard to perform dry etching on metal layer 20 when the thickness of metal layer 20 is large. Accordingly, it is desirable to reduce an increase in the thickness of metal layer 20.

In the experiment performed by the inventors of the present disclosure, the controllable taper angle was 70°. It was found that the thickness of metal layer 20 should be set with reference to the taper angle of 75° in view of a margin and variations in production. In this regard, the taper angle less than or equal to 75° can be an indicator of suppressing fluctuation in a gate threshold voltage in a high-temperature environment.

The coverage is 35% when the taper angle is 75°. Accordingly, metal layer 20 may have a thickness equal to or greater than 100 nm (=35 nm÷0.35) at upper surface 38u that is a flat part of the interlayer insulating layer. When the thickness of metal layer 20 is around 100 nm, metal layer 20 can be removed from upper surface 38u of the interlayer insulating layer by adjusting the amount of overetching at the time of removing source line 19 by dry etching. The increase in series resistance has proved to be small.

Then, a method for manufacturing semiconductor device 100 according to the present exemplary embodiment is described below. Hereinafter, descriptions of steps identical to those in the conventional technique may be omitted.

FIGS. 6A to 6J are schematic diagrams each showing an example of a manufacturing step of semiconductor device 100 according to the present exemplary embodiment.

The method for manufacturing semiconductor device 100 according to the present exemplary embodiment includes the steps described below.

Figure 6A:
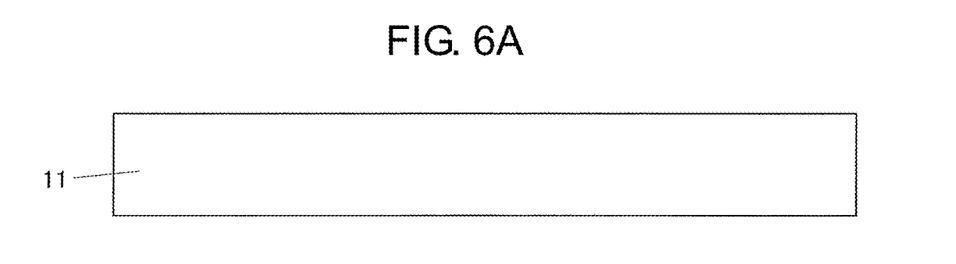
FIG. 6A is a schematic diagram showing an example of a manufacturing step of semiconductor device 100 according to the exemplary embodiment.

In a first step shown in FIG. 6A, semiconductor substrate 11 is prepared. Semiconductor substrate 11 may be provided by epitaxial growth of a semiconductor. Although not shown in FIG. 6A, the first step includes: a step of defining a region on semiconductor substrate 11 by forming a mask, a step of implanting impurities in the defined region; and a step of activating the impurities by a thermal treatment, in the same manner as a method for manufacturing a general silicon carbide semiconductor device. In this manner, a body region, a contact region connected to the body region, a source region, and the like are formed.

Figure 6B:
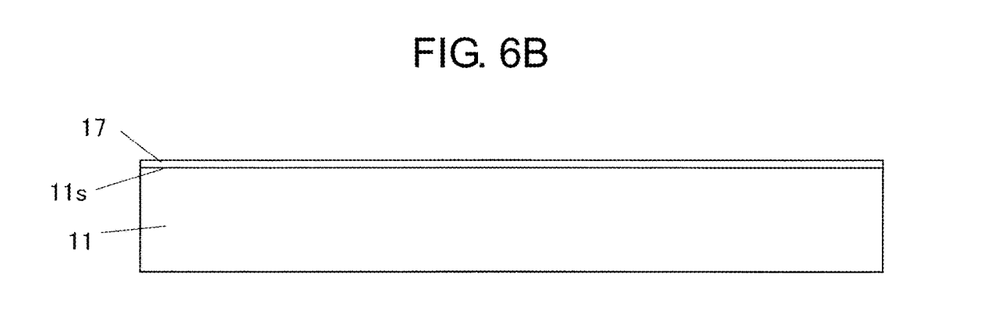
FIG. 6B is a schematic diagram showing an example of a manufacturing step of semiconductor device 100 according to the exemplary embodiment.

In a second step shown in FIG. 6B, gate insulating layer 17 is provided on surface 11s of the semiconductor substrate. Gate insulating layer 17 may be provided by thermal oxidation of surface 11s of the semiconductor substrate, or may be provided by depositing an insulating layer on surface 11s of the semiconductor substrate.

Figure 6C:
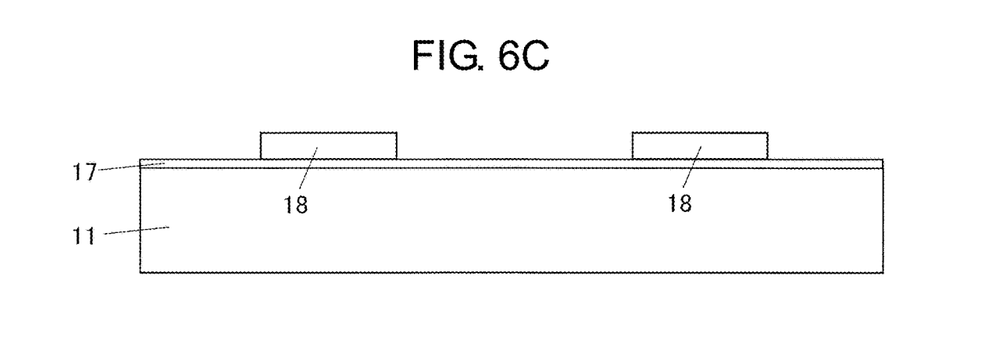
FIG. 6C is a schematic diagram showing an example of a manufacturing step of semiconductor device 100 according to the exemplary embodiment.

In a third step shown in FIG. 6C, gate electrode 18 is provided on gate insulating layer 17. Gate electrode 18 may be provided by patterning a conductive layer formed of polysilicon or a metal material.

Figure 6D:
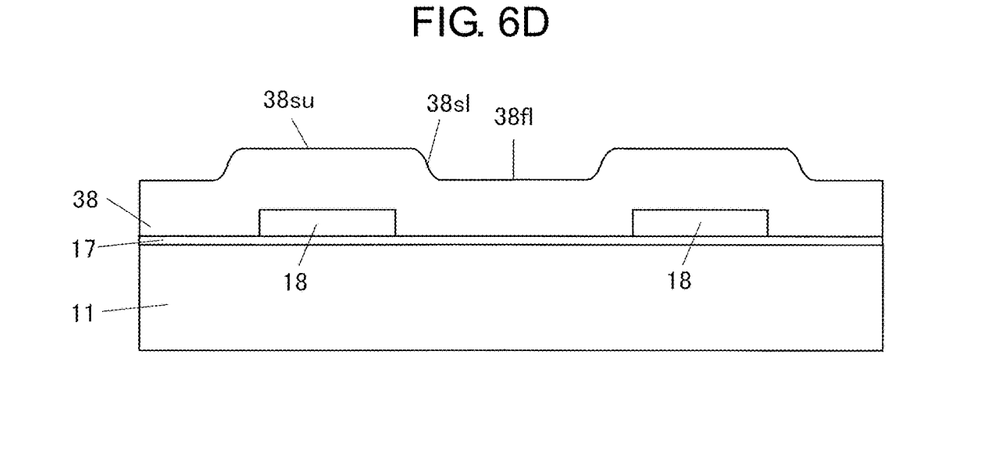
FIG. 6D is a schematic diagram showing an example of a manufacturing step of semiconductor device 100 according to the exemplary embodiment.

In a fourth step shown in FIG. 6D, gate electrode 18 is covered with interlayer insulating layer 38. Surface 38su of the interlayer insulating layer includes flat part 38fl and slope part 38sl in a region directly above gate insulating layer 17.

Figure 6E:
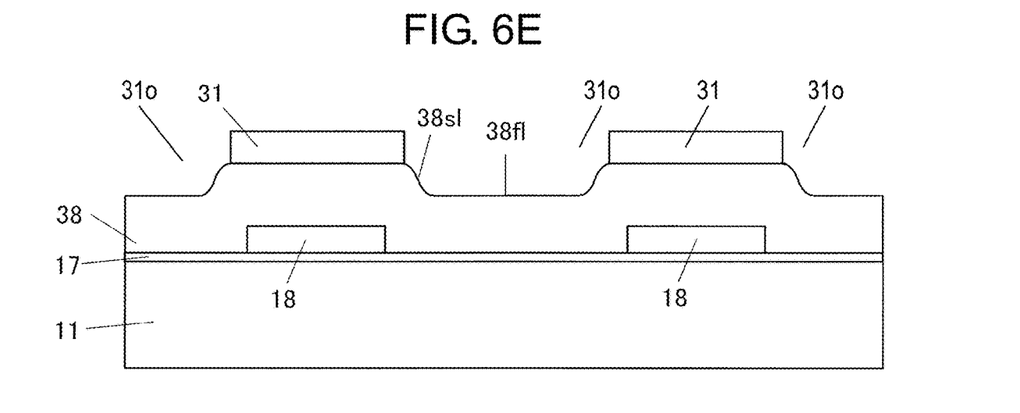
FIG. 6E is a schematic diagram showing an example of a manufacturing step of semiconductor device 100 according to the exemplary embodiment.

In a fifth step shown in FIG. 6E, mask layer 31 is provided on interlayer insulating layer 38. Mask layer 31 is provided with opening 31o that defines contact hole 23. Flat part 38fl and slope part 38sl are present in opening 31o of the mask layer. Mask layer 31 may be provided by patterning a photoresist.

Figure 6F:
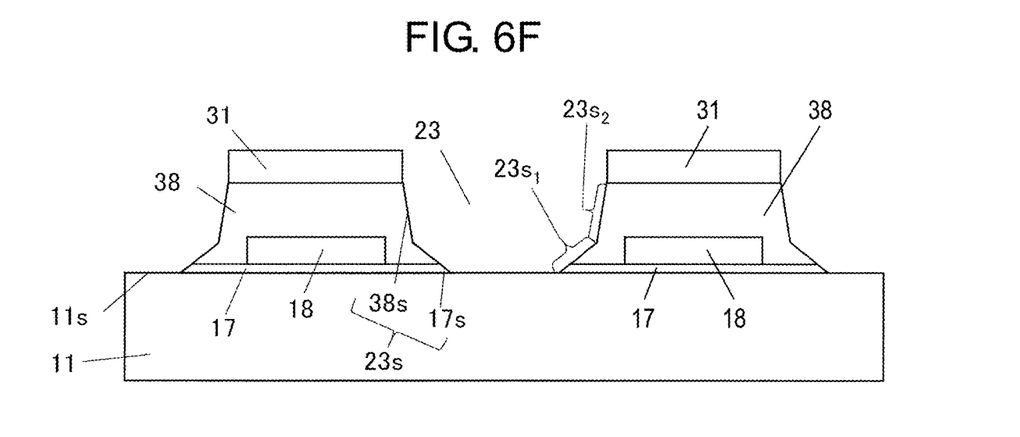
FIG. 6F is a schematic diagram showing an example of a manufacturing step of semiconductor device 100 according to the exemplary embodiment.

In a sixth step shown in FIG. 6F, contact hole 23 is provided to expose portion of surface 11s of the semiconductor substrate by etching interlayer insulating layer 38 and gate insulating layer 17 by using mask layer 31. As described above, inner surface 23s of the contact hole is defined by side surface 38s of the interlayer insulating layer and side surface 17s of the gate insulating layer. A mixed gas of $CHF_3$, $CF_4$, and Ar is used as an etching gas, for example. Etching is performed in a chamber for 60 seconds, and then the power is turned off and cooling is performed for 60 seconds while the gas is supplied. Contact hole 23 is provided by repeating this process.

Figure 6G:
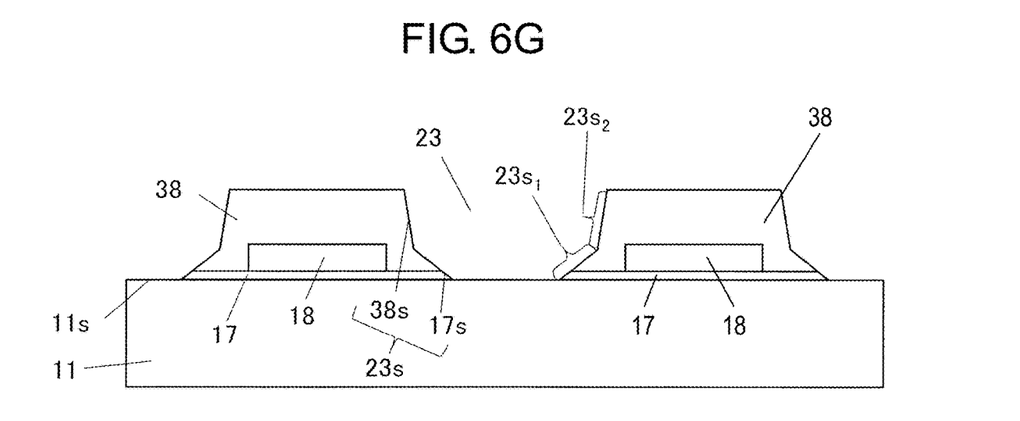
FIG. 6G is a schematic diagram showing an example of a manufacturing step of semiconductor device 100 according to the exemplary embodiment.

In a seventh step shown in FIG. 6G, mask layer 31 is removed.

Figure 6H:
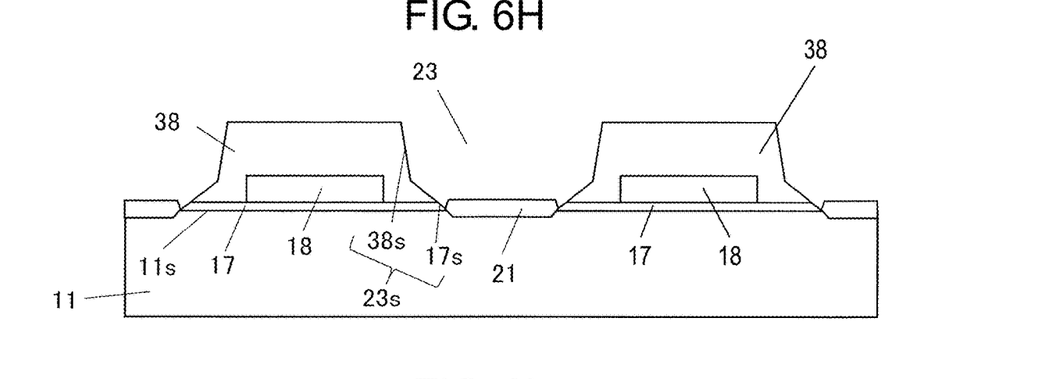
FIG. 6H is a schematic diagram showing an example of a manufacturing step of semiconductor device 100 according to the exemplary embodiment.

In an eighth step shown in FIG. 6H, silicide layer 21 is formed by performing annealing while covering the portion of surface 11s of the semiconductor substrate exposed by contact hole 23 with a metal such as Ni.

Figure 6I:
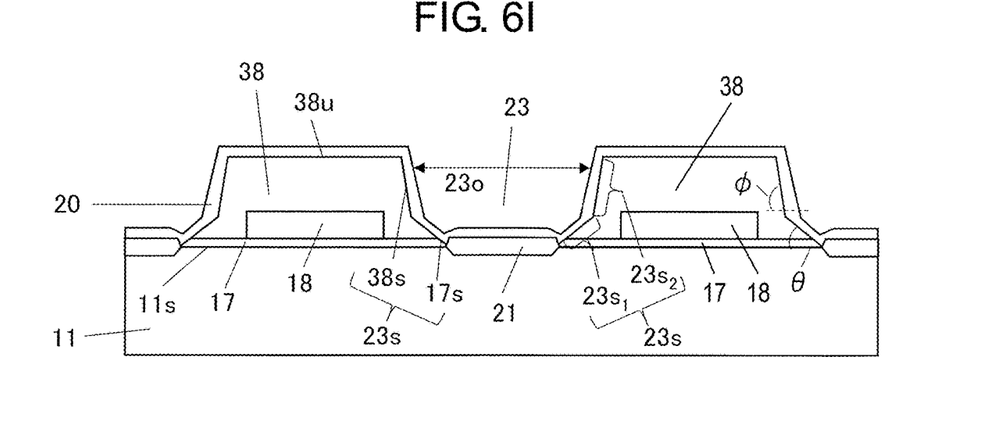
FIG. 6I is a schematic diagram showing an example of a manufacturing step of semiconductor device 100 according to the exemplary embodiment.

In a ninth step shown in FIG. 6I, metal layer 20 is provided to cover upper surface 38u of the interlayer insulating layer, inner surface 23s of the contact hole, and at least part of silicide layer 21. Metal layer 20 may be provided by sputtering a metal.

Figure 6J:
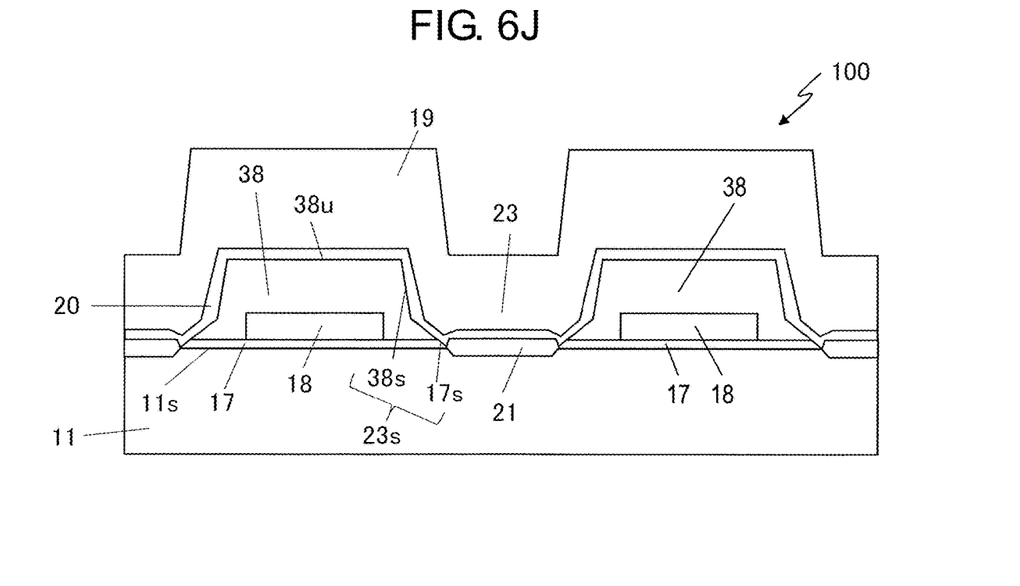
FIG. 6J is a schematic diagram showing an example of a manufacturing step of semiconductor device 100 according to the exemplary embodiment.

In a tenth step shown in FIG. 6J, source line 19 is provided. Source line 19 is connected, via contact hole 23, with at least part of metal layer 20 that covers the at least part of silicide layer 21.

Hereinafter, the reason why inner surface 23s of the contact hole has two different inclinations is described.

As shown in FIG. 6E, flat part 38fl and slope part 38sl produces a step on surface 38su of the interlayer insulating layer. Due to the step, flat part 38fl and slope part 38sl are etched differently from each other. Accordingly, as shown in FIG. 6F, inner surface 23s of the contact hole includes lower inner surface $23s_1$ and upper inner surface $23s_2$. An angle of inclination of lower inner surface $23s_1$ of the contact hole is smaller than an angle of inclination of upper inner surface $23s_2$ of the contact hole. This is because an angle of inclination of flat part 38fl is 0°, and an angle of inclination of slope part 38sl is large to a certain extent.

The manufacturing method of the present exemplary embodiment does not require an additional step of etching to provide inclination at inner surface 23s of the contact hole. Only with the sixth step shown in FIG. 6F, inclination is provided at inner surface 23s of the contact hole. Accordingly, metal layer 20 can be provided with a sufficient thickness at inner surface 23s of the contact hole with the number of steps identical to that of a conventional manufacturing method. This suppresses fluctuation of a gate threshold voltage in a high-temperature environment. As a result, reliability of semiconductor device 100 is improved.

According to conventional manufacturing methods, only flat part 38fl is exposed from mask layer 31 in the fifth step shown in FIG. 6E so that inner surface 23s of the contact hole is made substantially perpendicular to surface 11s of the semiconductor substrate.

Then, the relationship between etching rate uniformity in a wafer plane and a taper angle at the time of etching interlayer insulating layer 38 is described. The etching rate uniformity in a wafer plane is defined by dividing a difference between the maximum value and the minimum value among the etching rates at a plurality of points in a wafer plane with a value multiplying the average value of all points by two.

Figure 7:
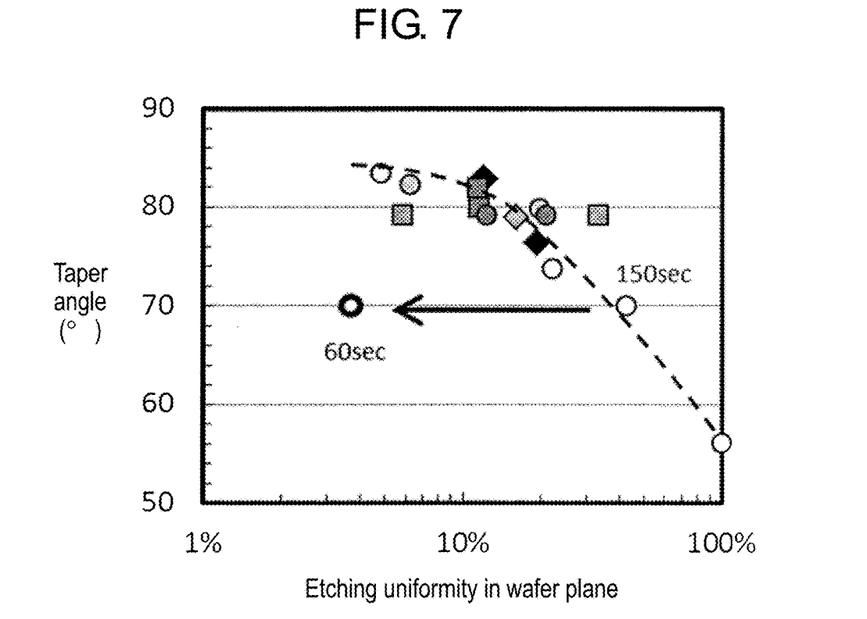
FIG. 7 is an example of a graph showing a relationship between etching rate uniformity in a wafer plane and taper angles at the time of etching interlayer insulating layer 38 by using a 6-inch wafer in FIG. 6F.

FIG. 7 is an example of a graph showing a relationship between etching rate uniformity in a wafer plane and taper angles at the time of etching interlayer insulating layer 38 by using a 6-inch wafer in FIG. 6F. The various types of plots shown in FIG. 7 represent the case where so-called etching parameters, such as a flow rate of an etching gas, a pressure, electric power, are changed. The result shown in FIG. 7 is a result of the experiment obtained by etching the flat substrate. Accordingly, the taper angle shown in FIG. 7 is equivalent to an angle of inclination at upper inner surface $23s_2$ of the contact hole.

As shown in FIG. 7, there is an inverse correlation between etching rate uniformity in a wafer plane and a taper angle in the case where etching time is set to 150 seconds, i.e., the time enables interlayer insulating layer 38 to be etched at a time. In other words, a small taper angle and good uniformity are incompatible.

Thus, the inventors of the present disclosure have examined the relation between the distribution of the etching rates in a wafer plane and the etching time.

Figure 8:
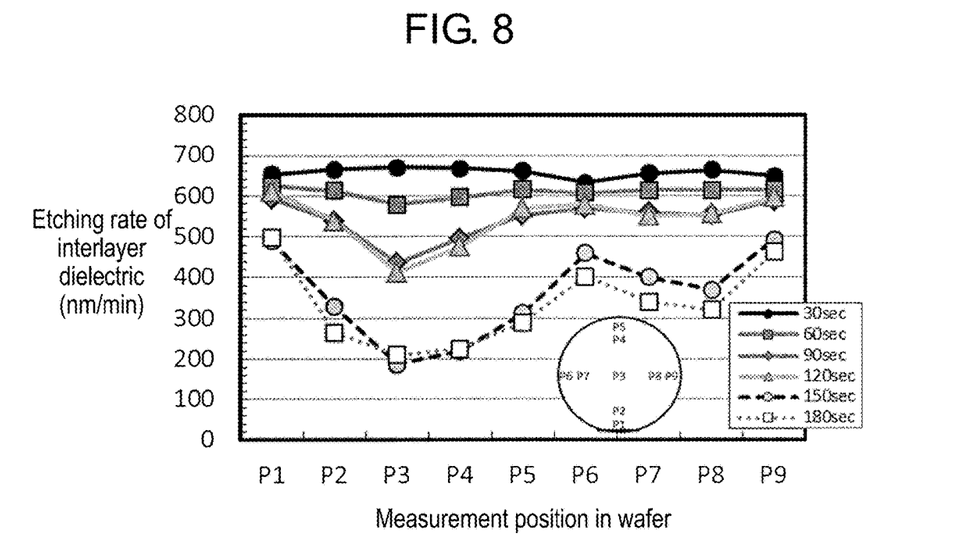
FIG. 8 is an example of a graph showing a relationship between measurement positions in a 6-inch wafer and etching rates in various lengths of time.

FIG. 8 is an example of a graph showing a relationship between measurement positions in a 6-inch wafer and etching rates in various lengths of etching time. As shown in FIG. 8, it was found that the etching rate decreases and the variations of the etching rates in a wafer plane are increased as the etching time increases. It was also found that the deterioration of etching rate uniformity in a wafer plane is reduced when the etching time is less than or equal to 60 seconds. This is mainly because the amount of deposited products varies depending on the etching time, at the time of depositing the products on the side wall of the etching chamber by excessively heating the interior of the etching chamber by an electric discharge.

The example in FIG. 7 shows a relationship between the etching rate uniformity in a wafer plane obtained from FIG. 8 and the taper angle where the etching time is 60 seconds. The etching time of 60 seconds enables a taper angle of 70° to be compatible with good etching rate uniformity in a wafer plane of less than or equal to 5%.

Interlayer insulating layer 38 cannot be thoroughly etched within the etching time of 60 seconds. Thus, the inventors of the present disclosure have found an etching method that can achieve both of a small taper angle and good uniformity even when interlayer insulating layer 38 is thick, by repeating an etching step for 60 seconds and a cooling step of performing cooling by suspending an electric discharge while maintaining a wafer in an etching chamber. This achieves semiconductor device 100 of high reliability and high quality that suppresses fluctuation of a gate threshold voltage in a high-temperature environment.

A semiconductor device and a method for manufacturing the same according to the present exemplary embodiment can be used for power devices and the like.

What is claimed is:

1. A semiconductor device comprising:
    a semiconductor substrate;
    a gate insulating layer disposed on a surface of the semiconductor substrate;
    a gate electrode disposed on the gate insulating layer;
    an interlayer insulating layer that covers the gate electrode;
    a contact hole that penetrates the gate insulating layer and the interlayer insulating layer, causes a portion of the surface of the semiconductor substrate to be exposed, and includes an inner surface defined by a side surface of the interlayer insulating layer and a side surface of the gate insulating layer;
    a metal layer that covers an upper surface of the interlayer insulating layer, the inner surface of the contact hole, and at least part of the portion of the surface of the semiconductor substrate exposed by the contact hole; and
    a source line connected, via the contact hole, with at least part of the metal layer that covers the at least part of the portion of the surface of the semiconductor substrate exposed by the contact hole,
    wherein the metal layer has a thickness equal to or greater than 35 nm at least at a portion that covers part of the inner surface of the contact hole near the surface of the semiconductor substrate, the inner-surface of the contact hole is part of an opening of the contact hole in a cross-sectional view perpendicular to the surface of the semiconductor substrate, the inner surface of the contact hole includes a first inner surface, and a second inner surface that is farther from the surface of the semiconductor substrate than the first inner surface, a first angle formed by the first inner surface of the contact hole and the surface of the semiconductor substrate is smaller than a second angle formed by the second inner surface of the contact hole and the surface of the semiconductor substrate, and the first angle is less than or equal to 75°, and a thickness of the metal layer adjacent a first portion of a side surface of the interlayer insulating layer is smaller than a thickness of the metal layer adjacent a second portion of the side surface of the interlayer insulating layer, the second portion of the side surface of the interlayer insulating layer being farther from the surface of the semiconductor substrate than the first portion of the side surface of the interlayer insulating layer.

2. The semiconductor device according to claim 1, wherein provided that a first thickness is a thickness of the metal layer at the portion that covers part of the inner surface of the contact hole near the surface of the semiconductor substrate, and a second thickness is a thickness of the metal layer at a portion that covers the upper surface of the interlayer insulating layer, the first thickness is equal to or greater than 35% of the second thickness.

3. The semiconductor device according to claim 1, wherein the portion of the surface of the semiconductor substrate exposed by the contact hole is a silicide layer.

4. The semiconductor device according to claim 3, wherein part of the silicide layer covers the side surface of the gate insulating layer.

5. The semiconductor device according to claim 1, wherein the metal layer has a two-layered structure comprising two different metals.

6. The semiconductor device according to claim 1, wherein the semiconductor device is a metal oxide semiconductor field effect transistor (MOSFET).

7. A semiconductor device comprising:

a semiconductor substrate;

a gate insulating layer disposed on a surface of the semiconductor substrate;

a gate electrode disposed on the gate insulating layer;

an interlayer insulating layer that covers the gate electrode;

a contact hole that penetrates the gate insulating layer and the interlayer insulating layer, causes a portion of the surface of the semiconductor substrate to be exposed, and includes an inner surface defined by a side surface of the interlayer insulating layer and a side surface of the gate insulating layer;

a metal layer that covers an upper surface of the interlayer insulating layer, the inner surface of the contact hole, and at least part of the portion of the surface of the semiconductor substrate exposed by the contact hole; and a source line connected, via the contact hole, with at least part of the metal layer that covers the at least part of the portion of the surface of the semiconductor substrate exposed by the contact hole, wherein the inner surface of the contact hole faces an opening of the contact hole in a cross-sectional view perpendicular to the surface of the semiconductor substrate, the inner surface of the contact hole includes a first inner surface close to the surface of the semiconductor substrate, and a second inner surface close to the opening of the contact hole, an angle formed by the first inner surface of the contact hole and the surface of the semiconductor substrate is smaller than an angle formed by the second inner surface of the contact hole and the surface of the semiconductor substrate, and a thickness of the metal layer adjacent a first portion of a side surface of the interlayer insulating layer is smaller than a thickness of the metal layer adjacent a second portion of the side surface of the interlayer insulating layer, the second portion of the side surface of the interlayer insulating layer being farther from the surface of the semiconductor substrate than the first portion of the side surface of the interlayer insulating layer.

* * * * *